United States Patent [19]
Okumura

[11] Patent Number: 5,370,300
[45] Date of Patent: Dec. 6, 1994

[54] METHOD AND APPARATUS FOR WIRE BONDING

[75] Inventor: Hiroshi Okumura, Kyoto, Japan

[73] Assignee: Rohm Co., Ltd., Kyoto, Japan

[21] Appl. No.: 94,336

[22] Filed: Jul. 20, 1993

[30] Foreign Application Priority Data

Jul. 22, 1992 [JP] Japan .................. 4-195656

[51] Int. Cl.⁵ .......................................... B23K 31/02
[52] U.S. Cl. .................. 228/180.5; 228/4.5; 219/56.22
[58] Field of Search .............. 228/180.5, 212, 4.5; 219/56.22

[56] References Cited

U.S. PATENT DOCUMENTS 4,583,676  4/1986  Pena et al. ............... 228/180.5
4,998,002  3/1991  Okikawa et al. ............ 228/4.5

FOREIGN PATENT DOCUMENTS 56-30118  7/1981  Japan .
60-158637  8/1985  Japan ..................... 228/4.5
62-136836  6/1987  Japan .
2-213146  8/1990  Japan ..................... 228/4.5

Primary Examiner—P. Austin Bradley
Assistant Examiner—Jeffrey T. Knapp
Attorney, Agent, or Firm—William H. Eilberg

[57] ABSTRACT

A method is provided for electrically connecting between first and second bonding portions of a workpiece by a metal wire which is provided with a meltable insulating coating and held by a bonding tool. The method comprises causing the bonding tool to press an end of the wire against the first bonding portion of the workpiece for bonding thereto, and causing the bonding tool to press an intermediate portion of the wire against the second bonding portion of the workpiece for bonding thereto. Before bonding to the second bonding portion, the wire intermediate portion is heated to a temperature higher than a melting point of the insulating coating but lower than that of the wire.

2 Claims, 3 Drawing Sheets

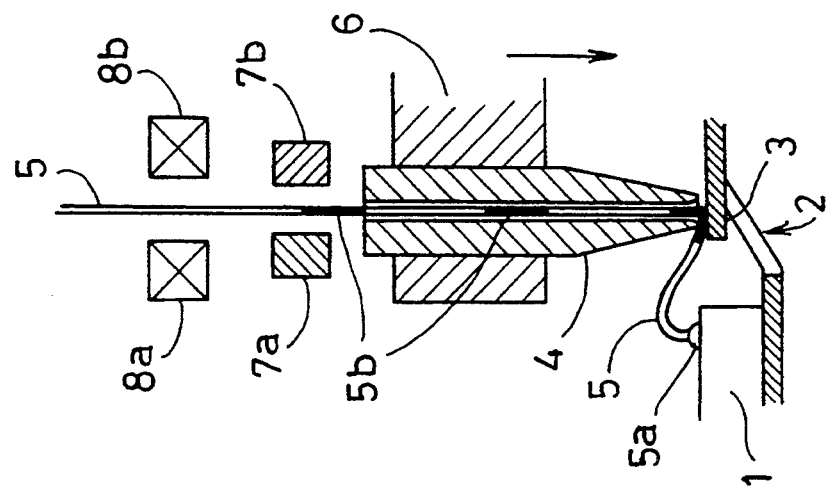
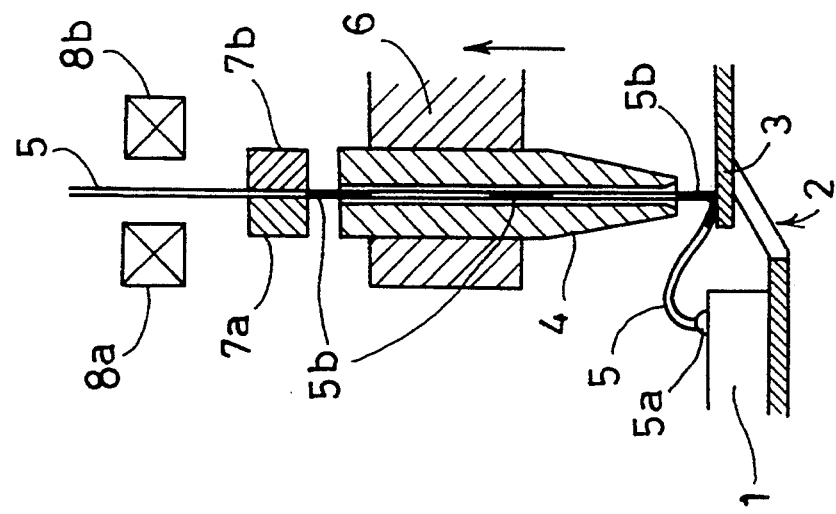

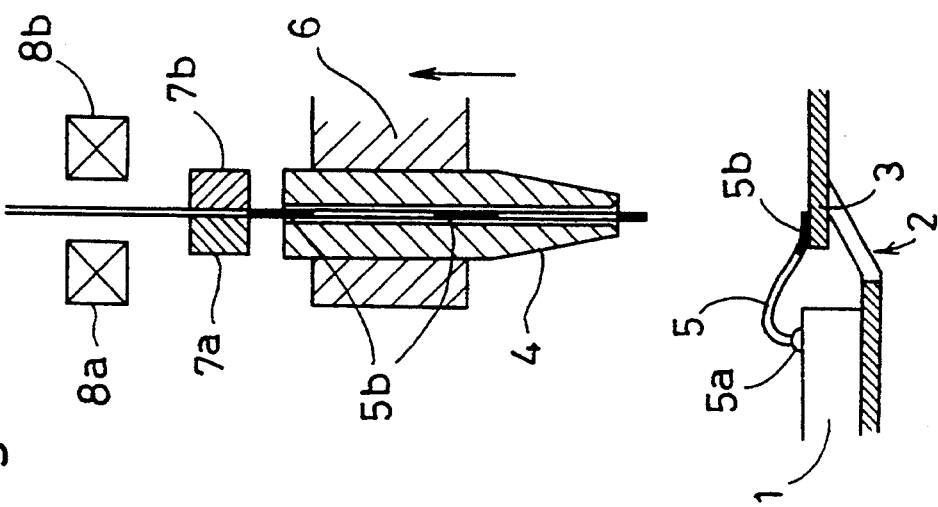

METHOD AND APPARATUS FOR WIRE BONDING

BACKGROUND OF THE INVENTION

1. Field of the Invention

This invention relates to the wire bonding technology in general. More specifically, the present invention relates to a method and apparatus for electrically connecting between two different portions of a workpiece (e.g. a leadframe or printed circuit board to which electronic components are mounted) by a thin metal wire.

2. Description of the Prior Art

In electronic circuits or components, it is usually necessary to electrically connect between two different portions of a workpiece. For instance, a lead of a semiconductor chip device need be electrically connected to a relevant bonding pad of the chip body through a metal wire. Further, a semiconductor chip mounted on a circuit board need be electrically connected through a metal wire to a relevant portion of a conductor pattern printed on the circuit board. An operation of bonding the metal wire for these purposes is called "wire bonding".

A typical prior art wire bonding method is disclosed in Japanese Patent Application Laid-open No. 62-136836 for example. The wire bonding method disclosed in this Japanese document comprises the following steps.

(1) A capillary tool, through which a metal wire is supplied longitudinally, is brought to a position directly above a first bonding portion (e.g. a semiconductor chip) of a workpiece (e.g. an electronic component) with a spark torch arranged between the lower end of the wire and the first bonding portion.

(2) Then, the lower end of the wire is melted into a ball by causing a spark discharge between the torch and the wire lower end.

(3) Then, the spark torch is retreated, and the capillary tool is lowered to press the lower ball end of the wire against the first bonding portion for bonding thereto.

(4) Then, after raising and bringing the capillary tool to a position directly above a second bonding portion (e.g. a lead or a printed conductor pattern) of the workpiece, the capillary tool is lowered again to press a suitable intermediate portion of the wire against the second bonding portion for bonding thereto.

(5) Finally, the capillary tool is raised again to tear-cut the wire to leave a segment thereof extending between the first and second bonding portions.

The metal wire, which is typically made of gold or aluminum, is generally provided with an insulating resin coating of e.g. polyimide. Such a coating mechanically reinforces the metal wire which is extremely thin and protects the wire against oxidation.

The insulating resin coating does not pose any problem in performing the first bonding wherein the wire lower end is melted into a ball before attachment to the first bonding portion. This is because a portion of the resin coating is melted away at the wire ball end due to the high temperature caused by the spark torch for melting the wire.

However, no melting of the wire nor the resin coating takes place at the time of performing the second bonding wherein the intermediate portion of the wire is attaches to the second bonding portion. Thus, the presence of the resin coating hinders direct metal to metal contact between the wire and the second bonding portion, so that the resulting bonding strength at the second bonding portion may be weak or the electrical connection thereat may be improper.

SUMMARY OF THE INVENTION

It is, therefore, an object of the present invention to provide a wire bonding method which enables a coated wire to be reliably bonded to a workpiece without damaging the wire coating at portions other than the bonding positions.

Another object of the invention is to provide an apparatus which is suitable for performing such a wire bonding method.

According to one aspect of the present invention, there is provided a wire bonding method for electrically connecting between first and second bonding portions of a workpiece by a metal wire which is provided with a meltable insulating coating and held by a bonding tool, the method comprising the steps of: causing the bonding tool to press an end of the wire against the first bonding portion of the workpiece for bonding thereto; and causing the bonding tool to press an intermediate portion of the wire against the second bonding portion of the workpiece for bonding thereto; wherein said intermediate portion of the wire is heated to a temperature which is higher than a melting point of the insulating coating but lower than a melting point of the wire before bonding said intermediate portion of the wire to the second bonding portion of the workpiece.

According to the wire bonding method described above, the insulating coating of the wire is melted away or otherwise made to have a reduced wall thickness by heating. Thus, it is possible to prevent a reduction of the bonding strength which would otherwise result from the presence of the insulating coating. Further, since the thermal melting of the insulating coating occurs partially only at the intermediate portion of the wire without causing thermal melting of the wire metal. It is possible to retain the intended reinforcing and protecting function of the insulating coating.

According to another aspect of the present invention, there is provided a wire bonding apparatus for electrically connecting between first and second bonding portions of a workpiece by a metal wire which is provided with a meltable insulating coating, the apparatus comprising: a bonding tool for holding the wire, the bonding tool being movable for pressing the wire against each of the first and second bonding portions of the workpiece to bonding thereto; and a heating means for locally heating a selected intermediate portion of the wire to a temperature which is higher than a melting point of the insulating coating but lower than a melting point of the wire.

With the arrangement described above, the heating means which may comprises a pair of clamp-type heating members is the sole element which is additional to the existing wire bonding apparatus. Thus, the wire bonding apparatus can be prepared on the basis of the existing wire bonding apparatus without complicating the structure and increasing the size.

Other objects, features and advantages of the present invention will become apparent from the following detailed description of the preferred embodiments given with reference to the accompanying drawings.

BRIEF DESCRIPTION OF THE DRAWINGS

In the accompanying drawings:

FIG. 3 is a view also similar to FIG. 1 but showing a third step of the wire bonding method;

FIG. 4 is a view also similar to FIG. 1 but showing a fourth step of the wire bonding method; and FIG. 5 is a view again similar to FIG. 1 but showing a fifth step of the wire bonding method.

DETAILED DESCRIPTION OF THE PREFERRED EMBODIMENTS

Figure 1:
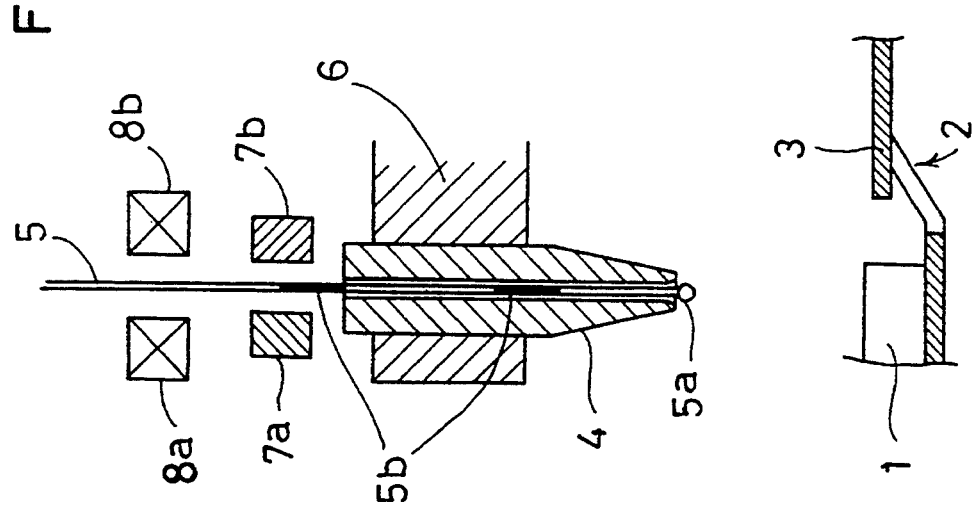
FIG. 1 is a front view, in vertical section, showing a first step of performing a wire bonding method by using a bonding apparatus according to the present invention.

Referring to the accompanying drawings, the wire bonding method according to the present invention is performed for example with respect to a leadframe 2 which carries a plurality of semiconductor chips 1 (only one shown) mounted thereon. The leadframe 2 integrally has groups of leads 3 (only one shown) associated with the respective chips 1. For simplicity, the wire bonding method is described below only with respect to a single semiconductor chip and a single lead associated therewith.

According to the illustrated embodiment, the apparatus for performing the wire bonding method includes a ceramic capillary tool 4 arranged above the leadframe 2. The capillary tool 4 continuously supplies a thin metal wire 5 which is provided, over the entire length thereof, with an insulating coating made of polyimide resin for example. The wire 5 may be made of gold or aluminum for example.

The capillary tool 4 is supported by a supporting horn 6 which causes the capillary tool 4 to move horizontally (laterally) and vertically. Further, a pair of clamp members 7a, 7b are arranged above the capillary tool 4. The respective clamp members 7a, 7b are brought closer to each other for clamping the wire 5 (see FIG. 4) at the time of separating a bonded portion of the wire 5, as described later.

According to the illustrated embodiment of the present invention, a pair of clamp-type heating member 8a, 8b are arranged further above the pair of clamp members 7a, 7b. The respective heating members 8a, 8b are capable of heating the wire 5 to a temperature above the melting point of the wire resin coating but below the melting point of the wire metal.

To give a clearer idea as to the heating ability of the heating members 8a, 8b, it is mentioned that the melting point of gold as one candidate for the wire metal is 1064.4° C., whereas the melting point of aluminum as another candidate for the wire material is 660.4° C. On the other hand, the melting point of polyimide resin as a wire coating material is usually less than 500° C.

The wire bonding apparatus described above may be used to perform the wire bonding method in the following manner.

In a first step, when the capillary tool 4 is raised apart from the semiconductor chip 1, a ball 5a is formed at the lower end of the metal wire 5 by bringing a torch (not shown) close to the wire lower end, as shown in FIG. 1. Such ball formation itself is known, and the wire bonding method using the ball end is called "ball bonding" or "nail head bonding".

Figure 2:
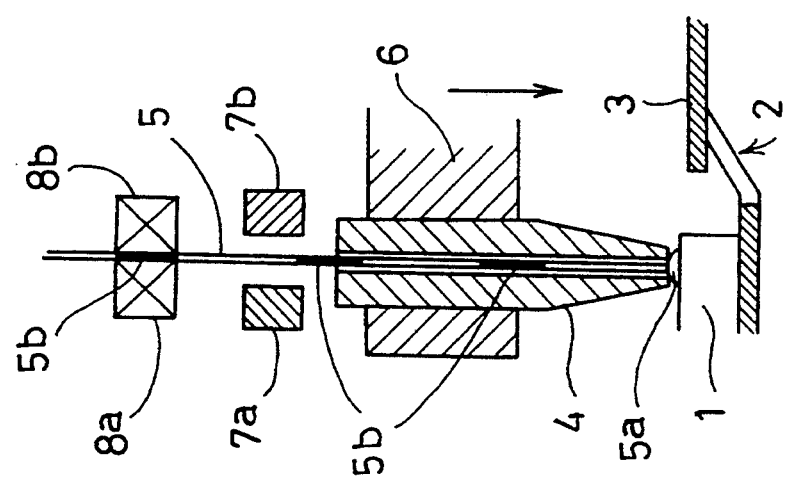
FIG. 2 is a view similar to FIG. 1 but showing a second step of the wire bonding method.

In a second step, the capillary tool 4 is lowered to press the lower ball end 5a of the wire 5 against the semiconductor chip 1, as shown in FIG. 2. As a result, the wire ball end 5a is deformed into a nail head for bonding to the semiconductor chip 5 with an increased bonding area.

Simultaneously with the second step of FIG. 2, the respective heating members 8a, 8b are brought closer to each other into clamping contact with the wire 5. As a result, the insulating resin coating of the wire 5 is removed by melting or otherwise rendered to have a reduced wall thickness.

In FIG. 2, the portions of the wire 5 which have undergone the above-described thermal treatment are indicated by reference numeral 5b. It should be appreciated that the lowest one of the thermally treated portions 5a is used for bonding in each process cycle of the wire bonding method.

In a third step, the capillary tool 4 is raised slightly and moved laterally to a position immediately above the lead 3 of the leadframe 2 while allowing the wire 5 to be supplied through the capillary tool. Then, the capillary tool is lowered again to press the wire 5 against the lead 3 at the lowest thermally treated portion 5a, as shown in FIG. 3. As a result, the wire 5 is bonded to the lead 3 at the lowest thermally treated portion 5a.

In a fourth step, the capillary tool 4 is slightly raised, and the respective clamp members 7a, 7b are brought closer to each other into pressing contact with the wire 5, as shown in FIG. 4. As a result, the wire 5 is prevented :from being supplied from the capillary tool 4.

Finally, in a fifth step, the capillary tool 4 is raised further with the clamp members 7a, 7b held in the clamping position, as shown in FIG. 5. As a result, the wire 5 is tear-cut at the relevant thermally treated portion 5b.

The above-described steps, which provide a single complete cycle of the wire bonding method, may be repeated with respect to other semiconductor chips and leads.

The wire bonding method described above greatly enhances the reliability of the second bonding which is the bonding between the lead 3 and the wire 5. Specifically, the thermal treatment provided by the pair of clamp-type heating members 8a, 8b causes the insulating resin coating of the wire 5 to be melted away or otherwise have a reduced wall thickness at each of the portions 5b, so that it is possible to prevent a reduction of the bonding strength which would otherwise result from the presence of the insulating resin coating.

Further, the thermal melting of the insulating resin coating occurs partially only at the specific portions 5b of the wire 5 without causing thermal melting of the wire metal. Thus, it is possible to retain the intended reinforcing and protecting function of the insulating resin coating.

In the illustrated embodiment, the first bonding for connecting the wire 5 to the semiconductor chip 1 is performed by using the ball (nail head) bonding technique wherein the lower end of the wire 5 is thermally melted for forming a ball 5a before bonding to the semiconductor chip 1. Obviously, since the insulating resin coating of the wire 5 is inevitably melted away at the time of forming the ball end 5a, the first bonding is inherently free from the problem of the insulating resin coating deteriorating the bonding strength.

On the other hand, if the first bonding is performed by using the so-called wedge bonding (see Japanese Patent Publication No. 56-30118 for example) wherein no ball is formed before bonding the metal wire 5 to the semiconductor chip 1, the insulating resin coating wire 5 should be thermally treated by the pair of heating members 8a, 8b in a manner such that the first bonding can be also performed at such a thermally treated portion of the wire 5.

The present invention being thus described, it is obvious that the same may be varied in many ways. For instance, the clamp-type heating members 8a, 8b may be replaced by another type of heating device. Further, the present invention is also applicable when electrically connecting between a printed circuit pattern and a semiconductor chip mounted on a circuit board. Such variations are not to be regarded as a departure from the spirit and scope of the the invention, and all such modifications as would be obvious to those skilled in the art are intended to be included within the scope of the following claims.

I claim:

1. A wire bonding method for electrically connecting between first and second bonding portions of a workpiece by a metal wire which is provided with a meltable insulating coating and held by a bonding tool, the method comprising the steps of:

causing a bonding tool to press an end of a wire against a first bonding portion of a workpiece for bonding thereto, the wire having a meltable insulating coating; and causing the bonding tool to press an intermediate portion of the wire against a second bonding portion of the workpiece for bonding thereto;

wherein said intermediate portion of the wire is heated to a temperature which is higher than a melting point of the insulating coating but lower than a melting point of the wire before bonding said intermediate portion of the wire to the second bonding portion of the workpiece, wherein said intermediate portion of the wire is heated by a pair of clamp-type heating members arranged above the bonding tool.

2. The method according to claim 1, wherein said end of the wire is melted into a ball before bonding to the first bonding portion of the workpiece.

* * * * *